United States Patent
Xiu

(10) Patent No.: US 10,558,238 B2
(45) Date of Patent: Feb. 11, 2020

(54) FREQUENCY SOURCE WITH AN ADJUSTABLE FREQUENCY AND RELATED SYSTEM, METHOD AND ELECTRONIC DEVICE

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 183 days.

(21) Appl. No.: 15/751,615

(22) PCT Filed: Aug. 24, 2017

(86) PCT No.: PCT/CN2017/098825
§ 371 (c)(1),
(2) Date: Feb. 9, 2018

(87) PCT Pub. No.: WO2018/126706
PCT Pub. Date: Jul. 12, 2018

(65) Prior Publication Data
US 2019/0361484 A1    Nov. 28, 2019

(30) Foreign Application Priority Data

Jan. 4, 2017  (CN) .......................... 2017 1 0004754

(51) Int. Cl.
*H03L 7/18*  (2006.01)
*G06F 1/04*  (2006.01)
(Continued)

(52) U.S. Cl.
CPC ................ *G06F 1/04* (2013.01); *H03L 7/085* (2013.01); *H03L 7/0991* (2013.01)

(58) Field of Classification Search
USPC .................................. 327/147–149, 156–158
See application file for complete search history.

(56) References Cited

U.S. PATENT DOCUMENTS 6,028,488 A * 2/2000 Landman ................. H03K 3/03
327/156
6,539,072 B1 * 3/2003 Donnelly .................. G06F 1/10
327/158
(Continued)

FOREIGN PATENT DOCUMENTS

CN    101114179 A    1/2008
CN    101375506 A    2/2009

OTHER PUBLICATIONS

International Search Report of PCT/CN2017/098825 in Chinese, dated Nov. 8, 2017 with English translation.
(Continued)

*Primary Examiner* — Adam D Houston
(74) *Attorney, Agent, or Firm* — Collard & Roe, P.C.

(57) ABSTRACT

The present disclosure relates to a frequency source with an adjustable frequency, and related system, method and electronic device, in particular to a frequency source with an adjustable frequency comprising an input terminal for receiving an input voltage signal, wherein the frequency source identifies a frequency of the input voltage signal. The present disclosure relates to a system comprising the frequency source, a method for identifying the frequency of the voltage signal, and an electronic device comprising the frequency source.

18 Claims, 6 Drawing Sheets

(51) Int. Cl.
*H03L 7/099* (2006.01)
*H03L 7/085* (2006.01)

(56) References Cited

U.S. PATENT DOCUMENTS

| | | | | | |
|---|---|---|---|---|---|
| 8,890,591 | B1* | 11/2014 | Xiu | ........................ | H03L 1/022 327/147 |
| 9,036,755 | B2* | 5/2015 | Xiu | ...................... | H03L 7/0807 375/355 |
| 9,118,275 | B1 | 8/2015 | Xiu | | |
| 9,379,714 | B1* | 6/2016 | Xiu | ...................... | G04F 10/005 |
| 9,582,028 | B1* | 2/2017 | Xiu | ........................... | G06F 1/12 |
| 9,621,173 | B1* | 4/2017 | Xiu | ........................ | H03L 7/197 |
| 2003/0001626 | A1* | 1/2003 | Kertis | .............. | G01R 19/16519 327/78 |
| 2008/0136532 | A1* | 6/2008 | Hufford | ................ | H03L 7/081 331/10 |
| 2008/0315928 | A1* | 12/2008 | Waheed | ................ | G04F 10/005 327/159 |
| 2011/0131439 | A1* | 6/2011 | Renner | .................... | G06F 1/08 713/401 |
| 2011/0187428 | A1* | 8/2011 | Kashmiri | ................ | H03L 1/022 327/159 |
| 2018/0196460 | A1* | 7/2018 | Xiu | ........................... | G06F 1/08 |
| 2018/0239307 | A1* | 8/2018 | Tsutsumi | .............. | G04F 10/005 |
| 2019/0052276 | A1* | 2/2019 | Xiu | ........................ | H03L 7/099 |
| 2019/0123749 | A1* | 4/2019 | Xiu | ........................ | H03L 7/099 |
| 2019/0238143 | A1* | 8/2019 | Xiu | ........................... | G06F 1/04 |
| 2019/0261472 | A1* | 8/2019 | Xiu | ........................ | H03K 3/017 |

OTHER PUBLICATIONS

Notice of Transmittal of the International Search Report of PCT/CN2017/098825 in Chinese, dated Nov. 8, 2017.

Written Opinion of the International Searching Authority of PCT/CN2017/098825 in Chinese, dated Nov. 8, 2017 with English translation.

Xiu, Liming. "Nanometer Frequency Synthesis Beyond the Phase-Locked Loop." IEEE Press, John Wiley & Sons, Inc., Publication, 2012, 334 pages.

Xiu, Liming, "From Frequency to Time-Average-Frequency: A Paradigm Shift int he Design of Electronic System." IEEE Press Series on Microelectronic Systems, John Wiley & Sons, Inc., Publication, 2015, 179 pages.

* cited by examiner

TAF-DPS DCO based Frequency Locked Loop

FREQUENCY SOURCE WITH AN ADJUSTABLE FREQUENCY AND RELATED SYSTEM, METHOD AND ELECTRONIC DEVICE

CROSS REFERENCE TO RELATED APPLICATIONS

This application is the National Stage of PCT/CN2017/098825 filed on Aug. 24, 2017, which claims priority under 35 U.S.C. § 119 of Chinese Application No. 201710004754.8 filed on Jan. 4, 2017, the disclosure of which is incorporated by reference.

The present application claims the priority of a Chinese patent application No. 201710004754.8 filed on Jan. 4, 2017, with an invention title of FREQUENCY SOURCE with an adjustable frequency and related system, method and electronic device. Herein, the content disclosed by the Chinese patent application is incorporated in full by reference as a part of the present disclosure.

TECHNICAL FIELD

The present disclosure relates to a frequency source with an adjustable frequency, which is used to identify a frequency of an input voltage signal. The present disclosure further relates to a system including the frequency source, a method for identifying a frequency of a voltage signal and an electronic device including the frequency source.

BACKGROUND

Capacitive sensing is an important technology for modern consumer electronics, appliances, residential control and Internet of things (IoT). Herein, a change in a capacitance value can be used for proximity/gesture detection, material analysis, liquid level sensing, and so on.

Temperature sensing is equally important in modern electronics. Two popular methods of temperature sensing are thermistor and resistance temperature detector (RTD). They measure temperature by correlating a resistance of the sensing element with temperature.

In both capacitorce and resistance based sensing, it needs to convert a change in resistance R value or capacitance C value into a voltage level or time, and then subsequently convert it into a digital value. In the process of converting the change in the resistance R value or the capacitance C value into the digital value, such change is firstly converted into the voltage level via an analog-to-digital converter ADC or converted into the time via a time-to-digital converter TDC, and then subsequently converted into a digital value. In the approach of using time to represent the change in capacitance/resistance value, the time used for RC charging and discharging is a target of interest. This time duration can be measured directly by using a clock signal with known frequency. Or, the capacitance/resistance under investigation can be made as part of a relaxation oscillator (also called stable multivibator) whose oscillation frequency is associated with the resistance value R and the capacitance C value.

In the prior art, the frequency source with a fixed frequency is used to measure the frequency of the relaxation oscillator, so as to measure the change in the resistance R value and the capacitance C value.

SUMMARY

There are provided in embodiments of the present disclosure a frequency source with an adjustable frequency, a system including the frequency source, a method for identifying a frequency of a voltage signal, and an electronic device including the frequency source.

According to one aspect of the present disclosure, there is provided a frequency source with an adjustable frequency, comprising an input terminal used to receive an input voltage signal, wherein the frequency source identifies a frequency of the input voltage signal.

In one implementation of the present disclosure, the input voltage signal of the frequency source is received from a resistive and capacitive sensing apparatus, wherein the resistive and capacitive sensing apparatus converts resistance and capacitance values into a voltage signal, and this voltage signal is input to the frequency source.

In one implementation of the present disclosure, the frequency source comprises a time-average-frequency direct period synthesis TAF-DPS clock generator, wherein the TAF-DPS clock generator comprises:

a first input terminal for receiving a base time unit $\Delta$;

a second input terminal for receiving a frequency/period control word $F=I+r$, where I is an integer, $0 \leq r < 1$;

a direct period synthesis unit for creating a first period $T_A = I*\Delta$ and a second period $T_B = (I+1)*\Delta$;

an output terminal for outputting a clock signal, which is formed by pulses with the first period $T_A$ and pulses with the second period $T_B$ in an interleaved manner, wherein possibilities of occurrence for the first period $T_A$ and the second period $T_B$ are controlled by a value of r;

wherein a frequency and a period of the TAF-DPS clock generator is calculated as $1/f_{TAF} = T_{TAF} = F*\Delta$, according to a time average frequency of the clock signal, and the control word F takes on a linear relationship with the period of the TAF-DPS clock generator. In the case of measuring a frequency of a voltage signal output by the resistive and capacitive sensing apparatus, the control word and a capacitance value or a resistance value of a measured resistive and capacitive sensing apparatus present a one-to-one correspondence relationship, so as to obtain a change in the capacitance value and the resistance value. Under the condition that resources used are sufficient enough, the TAF-DPS clock generator can almost generate any frequency, so that the sensing of frequency, and further for example, the sensing of the change in the resistance and capacitance values, can have higher sensibility.

In one implementation of the present disclosure, the base time unit $\Delta$ is generated by a multi-stage voltage-controlled oscillator, wherein the multi-stage voltage-controlled oscillator is locked to a reference frequency through a phase-locked loop, so that a frequency $f_{vco}$ of the multi-stage voltage-controlled oscillator is a given value, and the multi-stage voltage-controlled oscillator outputs K signals of which phases are shift equably, where K is an integer greater than 1, and the base time unit $\Delta$ can be calculated as:

$$\Delta = T_{VCO}/K = 1/(K \cdot f_{vco})$$

wherein $T_{VCO}$ represents a period of the multi-stage voltage-controlled oscillator.

In one implementation of the present disclosure, I and r are input by a user, wherein accuracy of the frequency of the TAF-DPS clock generator is associated with digits allocated to r.

In one implementation of the present disclosure, the frequency source comprises a TAF-DPS vernier caliper, and the TAF-DPS vernier caliper comprises:

a first TAF-DPS clock generator, used as a slow TAF-DPS clock generator, wherein the first TAF-DPS clock generator comprises a second input terminal for receiving a slow control word $F_{slow}$, and a third input terminal for receiving a start signal of one pulse period of the input voltage signal, and is configured to output a slow clock signal at its output terminal;

a second TAF-DPS clock generator, used as a fast TAF-DPS clock generator, wherein the second TAF-DPS clock generator comprises a second input terminal for receiving a fast control word $F_{fast}$, and a third input terminal for receiving a stop signal of the pulse period of the input voltage signal, and is configured to output a fast clock signal at its output terminal;

a phase detector, configured to detect a coincidence point of the slow clock signal and the fast clock signal, wherein edges of the slow clock signal and the fast clock signal are aligned at the coincidence point, and the phase detector comprises a first input terminal for receiving the slow clock signal, a second input terminal for receiving the fast clock signal, and an output terminal for outputting a reset signal when the coincidence point is detected;

a first digital counter, comprising a clock input terminal for receiving the slow clock signal, a reset input terminal for receiving the reset signal from the phase detector, and an output terminal for outputting the slow clock signal stored in the first digital counter when the reset signal is received, wherein the number of iterations of the output slow clock signal is stored as a first digital value, and the first digital counter is reset after the stored slow clock signal is output;

a second digital counter, comprising a clock input terminal for receiving the fast clock signal, a reset input terminal for receiving the reset signal from the phase detector, and an output terminal for outputting the fast clock signal stored in the second digital counter when the reset signal is received, wherein the number of iterations of the output fast clock signal is stored as a second digital value, and the second digital counter is reset after the stored fast clock signal is output; and a calculation module, configured to calculate a time of flight (TOF) between the start signal and the stop signal according to the first digital value and the second digital value, so as to obtain a period of the input voltage signal, i.e., a change in the frequency of the measured voltage signal. For example, in the case of measuring a period of a voltage signal output by a resistive and capacitive sensing apparatus such as a relaxation oscillator, the change in its capacitance value and resistance value can be obtained.

In one implementation of the present disclosure, the slow control word $F_{slow}$=I, where I is an integer greater than or equal to 2, and the fast control word $F_{fast}$=(I−1)+r.

In one implementation of the present disclosure, the first TAF-DPS clock generator comprises:

a first digital-controlled oscillator, configured to generate a slow base time unit $\Delta_{slow}$;

a first TAF-DPS frequency synthesizer, configured to output a slow TAF clock signal according to the $F_{slow}$ and the slow base time unit $\Delta_{slow}$ obtained from the first digital-controlled oscillator.

In one implementation of the present disclosure, the second TAF-DPS clock generator comprises:

a second digital-controlled oscillator, configured to generate a fast base time unit $\Delta_{fast}$;

a second TAF-DPS frequency synthesizer, configured to output a fast TAF clock signal according to the fast control word $F_{slow}$ and the fast base time unit $\Delta_{fast}$ obtained from the second digital-controlled oscillator, 1× PLL (a phase-locked loop whose frequency division ratio is 1), configured to receive the fast TAF clock signal from the second TAF-DPS frequency synthesizer as an input signal, and output the slow clock signal as an output signal according to the input signal, where a frequency ratio of the input signal and the output signal is 1.

In one implementation of the present disclosure, the frequency source comprises a frequency-locked loop constructed based on the TAF-DPS clock generator, wherein the input voltage signal, for example, the output voltage signal of the resistive and capacitive sensing apparatus, is input to the frequency-locked loop as a reference signal, the reference signal is compared with the clock signal generated by the TAF-DPS clock generator in terms of frequency, and the control word F of the TAF-DPS clock generator is adjusted iteratively according to a comparison result until the frequency of the generated clock signal is consistent with the frequency of the reference signal, so as to obtain the frequency of the reference signal according to the control word F, so as to further obtain the change in the frequency of the input voltage signal. For example, the change in the capacitance value and the resistance value of the resistive and capacitive sensing apparatus can be calculated based on the change in the frequency.

In one implementation of the present disclosure, the frequency-locked loop comprises:

a frequency detector, a low-pass filter connected to the downstream of the frequency detector and a TAF-DPS digital-controlled oscillator connected to the downstream of the low-pass filter.

In one implementation of the present disclosure, the frequency detector is configured to detect a difference between a frequency $f_r$ of the reference signal input to the frequency detector and a frequency $f_o$ of the output signal of the frequency-locked loop, and output a difference variable; the low-pass filter is configured to generate a control variable used for the TAF-DPS digital-controlled oscillator at the downstream after performing low-pass filtering on the difference variable to remove a high frequency component, wherein the control variable comprises a control word F; the TAF-DPS digital-controlled oscillator is configured to generate an output signal with the frequency $f_o$ according to the control variable, wherein the output signal is transmitted to the frequency detector.

In one implementation of the present disclosure, in the frequency detector, the number of rising edges of the reference signal detected within one period of the output signal output from the frequency-locked loop and having the known frequency $f_o$ is determined, wherein the frequency $f_r$ of the reference signal is unknown;

If two or more rising edges of the reference signal are detected within one period of the output signal, then it can be determined the fact of $f_r > f_o$;

Otherwise, by considering a half period of the output signal as a basis which includes one rising edge and one falling edge of the output signal, take the rising edge and the falling edge within the half period of the output signal as a sampling time point to sample the reference signal. If one rising edge and one falling edge of the reference signal are sampled, then it is determined $f_r = f_o$; otherwise, it is determined $f_r < f_o$.

In one implementation of the present disclosure, the frequency-locked loop further includes a frequency divider connected between the TAF-DPS digital-controlled oscillator and the frequency detector.

In one implementation of the present disclosure, the frequency detector is configured to detect a difference between a frequency $f_r$ of the reference signal input to the frequency detector and a frequency $f_o'$ of a signal from the frequency divider, and output a difference variable; the low-pass filter is configured to generate a control variable used for the TAF-DPS digital-controlled oscillator at the downstream after performing low-pass filtering on the difference variable to remove a high frequency component, wherein the control variable comprises the control word F; the TAF-DPS digital-controlled oscillator is configured to generate the output signal with the frequency $f_o$ according to the control variable; the frequency divider is configured to divide the frequency of the output signal with a factor of 1/N so as to generate a signal with the frequency $f_o'$, and the signal with the frequency $f_o'$ is delivered to the frequency detector, where N is an integer greater than or equal to 1.

In one implementation of the present disclosure, in the frequency detector, the number of rising edges of the reference signal detected within each period which is from the frequency divider and has the frequency $f_o'$ is determined, wherein the frequency $f_r$ of reference signal is unknown;

If two or more rising edges of the reference signal are detected within one period of the output signal, then it is determined the fact of $f_r > f_o'$, Otherwise, by considering a half period of the output signal as a basis which includes one rising edge and one falling edge of the output signal, take the rising edge and the falling edge within the half period of the output signal as a sampling time point to sample the reference signal. If one rising edge and one falling edge of the reference signal are sampled, then it is determined $f_r = f_o'$; otherwise, it is determined $f_r < f_o'$.

In one implementation of the present disclosure, both the difference variable and the control variable are digital values.

According to one aspect of the present disclosure, there is further provided in the present disclosure a system for detecting the change in the resistance and capacitance values of the resistive and capacitive sensing apparatus. The system comprises a reference source whose frequency is adjustable according to the frequency of the present disclosure, a resistive and capacitive sensing apparatus and a comparison unit, wherein the resistive and capacitive sensing apparatus converts a resistance value and a capacitance value into a voltage signal, the frequency source identifies a frequency of the voltage signal, wherein the comparison unit compares the identified frequency with the frequency of the voltage signal previously stored in the resistive and capacitive sensing apparatus, and in the case of determining there is a change in the frequency of the voltage signal, it is determined that there is a change in the resistance and capacitance values of the resistive and capacitive sensing apparatus.

In one implementation of the present disclosure, the resistive and capacitive sensing apparatus is a relaxation oscillator, wherein the relaxation oscillator comprises an operational amplifier and a sensing capacitor connected to one input terminal of the operational amplifier, wherein the operational amplifier outputs a voltage signal having a frequency related to the resistance and capacitance values in the relaxation oscillator.

According to another aspect of the present disclosure, there is further provided in the present disclosure a method for identifying a frequency of a voltage signal, wherein the voltage signal is input to the frequency source with an adjustable frequency according to the frequency of the present disclosure, and the frequency source identifies the frequency of the input voltage signal.

In one implementation of the present disclosure, the method for identifying the frequency of the voltage signal comprises following steps:

converting the resistance and capacitance values into the voltage signal through the resistive and capacitive sensing apparatus;

delivering the voltage signal to the frequency source with an adjustable frequency and identifying a frequency of the voltage signal through the frequency source with an adjustable frequency;

determining whether there is change by comparing the frequency of the voltage signal with the frequency of the voltage signal previously stored in the resistive and capacitive sensing apparatus; if there is a change, then it is determined that there is a change in the resistance and capacitance values.

In one implementation of the present disclosure, the output signal of the resistive and capacitive sensing apparatus is input to a frequency-locked loop constructed based on the TAF-DPS clock generator as a reference signal;

The reference signal is compared with the clock signal generated by the TAF-DPS clock generator in terms of frequency;

The control word F of the TAF-DPS clock generator is iteratively adjusted according to a comparison result until the frequency of the generated clock signal is consistent with the reference signal, so as to obtain the frequency of the reference signal according to the control word F; and The change in the resistance and capacitance values of the resistive and capacitive sensing apparatus is obtained.

In one implementation of the present disclosure, the frequency-locked loop comprises: a frequency detector, a low-pass filter connected to the downstream of the frequency detector, and A TAF-DPS DCO connected to the downstream of the low-pass filter.

In one implementation of the present disclosure, a difference between a frequency $f_r$ of the reference signal input to the frequency detector and a frequency $f_o$ of the output signal of the frequency-locked loop is detected by the frequency detector, and a difference variable is output;

a control variable used for the TAF-DPS digital-controlled oscillator at the downstream is generated after low-pass filtering is conducted on the difference variable by the low-pass filter to remove a high frequency component, wherein the control variable comprises a control word F;

an output signal having the frequency $f_o$ is generated according to the control variable by the TAF-DPS digital-controlled oscillator; and the output signal is delivered to the frequency detector.

In one implementation of the present disclosure, in the frequency detector, a number of rising edges of the reference signal detected within each period of the output signal output from the frequency-locked loop and having the known frequency $f_o$ is determined, wherein the frequency $f_r$ of the reference signal is unknown;

If two or more rising edges of the reference signal are detected within one period of the output signal, then it can be determined the fact of $f_r > f_o$;

Otherwise, by considering a half period of the output signal as a basis which includes one rising edge and one falling edge of the output signal, take the rising edge and the falling edge of the output signal within the half period as a sampling time point to sample the reference signal, if one rising edge and one falling edge of the reference signal are sampled, then it is considered $f_r = f_o$; otherwise, it is considered $f_r < f_o$.

In one implementation of the present disclosure, the frequency-locked loop further includes a frequency divider connected between the TAF-DPS digital-controlled oscillator and the frequency detector.

In one implementation of the present disclosure, a difference between the frequency $f_r$ of the reference signal input to the frequency detector and a frequency $f_o'$ of a signal from the frequency divider is detected by the frequency detector, and a difference variable is output;

a control variable used for the TAF-DPS digital-controlled oscillator at the downstream is generated after low-pass filtering is conducted on the difference variable by the low-pass filter to remove a high frequency component, wherein the control variable comprises a control word F;

the output signal having the frequency $f_o$ is generated according to the control variable by the TAF-DPS digital-controlled oscillator, the frequency of the output signal is divided by the frequency divider with a factor of 1/N to obtain a signal having the frequency $f_o'$; and the signal having the frequency $f_o'$ is delivered to the frequency detector, where N is an integer greater than or equal to 1.

In one implementation of the present disclosure, in the frequency detector, a number of rising edges of the reference signal detected within each period which is from the frequency divider and has a frequency $f_o'$ is determined, wherein the frequency $f_r$ of reference signal is unknown;

If two or more rising edges of the first signal are detected within one period of the output signal are detected, then it is determined the fact of $f_r > 1'_0$;

Otherwise, by considering a half period of the output signal as a basis, the half period of the output signal includes one rising edge and one falling edge; by taking the rising edge and the falling edge within the half period of the output signal as a sampling time point to sample the reference signal, if one rising edge and one falling edge of the reference signal are sampled, then it is considered $f_r = f_o'$; otherwise, it is considered $f_r < f_o'$.

In one implementation of the present disclosure, both the difference variable and the control variable are digital values.

According to another aspect of the present disclosure, there is further provided in the present disclosure an electronic device comprising the frequency source according to the present disclosure.

The frequency source with an adjustable frequency is provided by utilizing the frequency programmability of the TAF-DPS according to the present disclosure, and it is used to detect the change in the resistance and capacitance values of the resistive and capacitive sensing apparatus, and can provide any frequency under the condition of sufficient computing resources, so as to provide accuracy of measurement.

BRIEF DESCRIPTION OF THE DRAWINGS

The preferred embodiments of the present disclosure are described in detail by combining with the figures. The above and other purposes, characteristics and advantages of the present disclosure would become clear, wherein a same reference mark refers to a unit having a same structure, wherein.

For the purpose of overview, same reference marks are given for the same or equivalent elements appearing in all the figures. The figures are just for illustration, and elements in the figures do not have to be proportionate.

DETAILED DESCRIPTION

Technical solutions in embodiments of the present disclosure will be described clearly and completely by combining with the figures. Obviously, the embodiments described below are a part of embodiments of the present disclosure, but not all the embodiments. For those ordinary skilled in the art, other embodiments can be obtained based on these embodiments, without paying any inventive labor.

Figure 1:
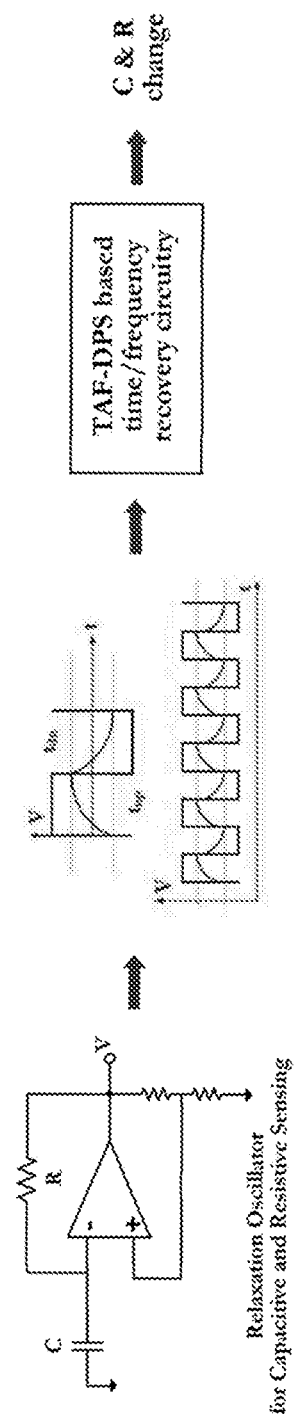
FIG. 1 schematically shows measuring a change in resistance and capacitance values of a resistive and capacitive sensing apparatus by using a system according to the present disclosure.

FIG. 1 schematically shows measuring a change in resistance and capacitance values of a resistive and capacitive sensing apparatus by using a system according to the present disclosure. The system comprises a relaxation oscillator 100 and a frequency source with an adjustable frequency according to the present disclosure.

The right figure of FIG. 1 shows the frequency source according to the present disclosure, which is implemented as a time/frequency recovery circuit based on a Time-Average-Frequency Direct Period Synthesis (TAF-DPS) in the present embodiment. An output voltage signal of the relaxation oscillator 100 is received by an input terminal of the frequency source with an adjustable frequency according to the present disclosure, and the frequency of the output voltage signal is detected by the frequency source.

The left figure of FIG. 1 shows the relaxation oscillator 100, comprising an operational amplifier 101 and a sensing capacitor C. An output voltage terminal V of the operational amplifier 101 is connected to a ground via a first resistor R and a sensing capacitor C, and the connection node between the first resistor R and the sensing capacitor C is connected to a negative input terminal of the operational amplifier 101. A voltage output by the output voltage terminal V of the operational amplifier 101 is delivered to a positive input terminal of the operational amplifier 101 after the voltage is divided via a voltage dividing circuit composed of a resistor R2 and a resistor R3. After oscillation starts up, the operational amplifier 101 outputs a voltage signal, which has a frequency related to the resistance and capacitance values in the relaxation oscillator 100. Thus it can be seen that the change in the resistance and capacitance values can be known by detecting the frequency. In the prior art, the frequency of the relaxation oscillator is measured by a frequency source with a fixed frequency, so as to measure the change in the resistance and capacitance values. Inventor(s) of the present disclosure note that, a resolution of the existing system is limit, and it is at most the period of the frequency source. Therefore, inventor(s) of the present application proposes the frequency source with an adjustable frequency and based on the TAF-DPS clock generator.

The figure below the middle of FIG. 1 schematically shows a pulse sequence output by the relaxation oscillator 100. When the resistance value or the capacitance value of the relaxation oscillation 100 changes, a frequency or a period of the pulse sequence would change correspondingly. The figure above the middle of FIG. 1 shows that each signal period of the pulse sequence comprises two pulses, wherein a first pulse comprises a rising edge $t_{up}$, and a second pulse comprises a falling edge $t_{do}$.

The pulse sequence is delivered to the frequency source with an adjustable frequency according to the present disclosure, so as to know the change in the resistance and capacitance values of the relaxation oscillator 100 by measuring the change in the frequency of the pulse sequence. In particular, the voltage signal which is output by the relaxation oscillator 100 and related to the resistance and capacitance values is input to the frequency source with an adjustable frequency according to the present disclosure as shown in the right figure of FIG. 1. The frequency source identifies the frequency of the input voltage signal. In the present embodiment, the frequency source with an adjustable frequency according to the present disclosure is based on a time/frequency recovery circuit of the TAF-DPS which comprises a TAF-DPS clock generator.

The Time-Average-Frequency Direct Period Synthesis (TAF-DPS) is an emerging frequency synthesis architecture based on the new concept of time-averaged frequency. The prominent characteristics of TAF-DPS comprise a small frequency granularity (also called as a random frequency generation) and a fast frequency switch (also called as an instantaneous frequency switch). More importantly, its frequency switching speed is measurable. In other words, a response time from the moment when an update of a frequency control word is received to the moment when the frequency is switched can be calculated according to a clock period.

Figure 2:
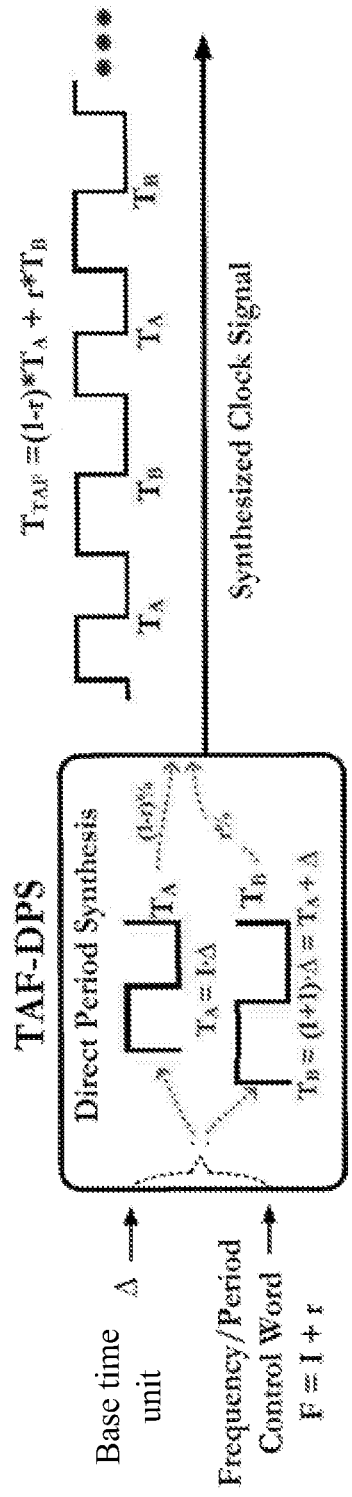
FIG. 2 schematically shows a TAF-DPS clock generator and its working principle.

FIG. 2 schematically shows a TAF-DPS clock generator and its working principle.

The TAF-DPS clock generator comprises:

a first input terminal for receiving a base time unit $\Delta$;

a second input terminal for receiving a frequency/period control word F=I+r, where I is an integer, and r is a fraction of 0≤r<1;

a direct period synthesis unit for creating a first period $T_A=I*\Delta$ and a second period $T_B=+1)*\Delta$; and an output terminal for outputting a clock signal which is composed of pulses with the first period $T_A$ and pulses with the second period $T_B$ in an interleaved manner, wherein possibilities of occurrence for the first period $T_A$ and the second period $T_B$ are controlled by the value of r. In particular, the possibility of occurrence for the first period $T_A$ is (1-r)%, and the possibility of occurrence for the second period $T_B$ is r %, wherein the frequency and the period of the TAF-DPS clock generator is calculated as $1/f_{TAF}=T_{TAF}=F*\Delta$ according to the tine average frequency of the clock signal, and the control word F takes on a linear relationship with the period of the TAF-DPS clock generator, thereby taking on a one-to-one correspondence relationship with the measured capacitance value or resistance value of the resistive and capacitive sensing apparatus, so as to obtain the change in the capacitance value or the resistance value.

In one implementation of the present disclosure, I and r are input by the user, wherein the accuracy of the frequency of the TAF-DPS clock generator is related to the digits allocated to r.

It can be known from the above calculation formula for the control word F and the time average frequency that, under a condition of capacity of a storage being large enough, i.e., given enough digits for r of the control word F, the TAF-DPS clock generator can generate any frequency. That is to say, the TAF-DPS clock generator is capable of realizing precise frequency measurement of small granularity. In addition, since each individual pulse is constructed directly, the output frequency of the TAF-DPS clock generator can change instantly, i.e., having the characteristics of fast frequency switching. Being capable of generating any frequency and being capable of performing frequency switch quickly are also major advantages of the TAF-DPS clock generator compared with a general frequency source.

Figure 3:
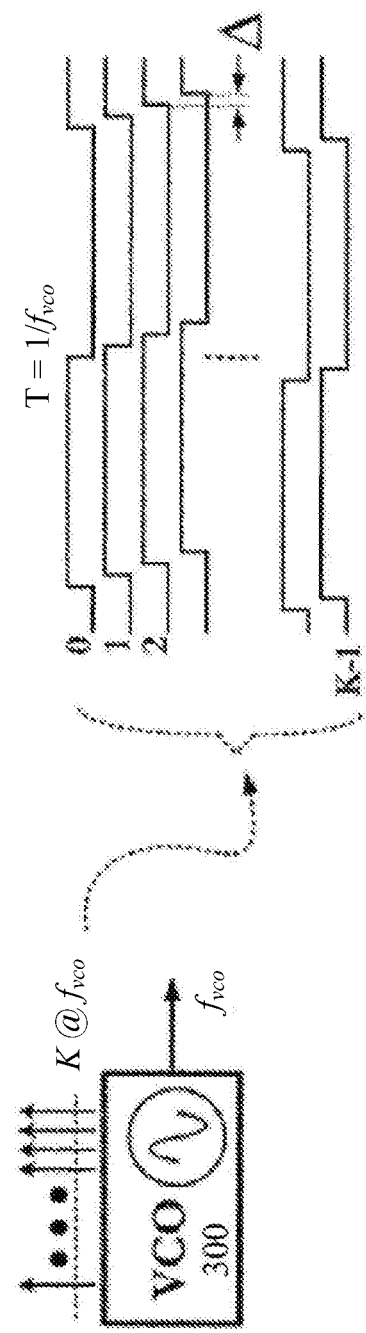
FIG. 3 shows a voltage-controlled oscillator VCO 300 generating a base time unit Δ.

FIG. 3 shows a voltage-controlled oscillator VCO 300 that generates the base time unit $\Delta$. The value of the base time unit $\Delta$ is a time interval between two adjacent VCO outputs. The base time unit $\Delta$ is produced by a multi-stage voltage-controlled oscillator VCO, wherein the multi-stage voltage-controlled oscillator VCO is locked to a reference frequency by a phase-locked loop, so that a frequency $f_{vco}$ of the multi-stage voltage-controlled oscillator VCO is a given value. The multi-stage voltage-controlled oscillator VCO outputs K signals of which phases are shift equably, where K is an integer greater than 1, thus the base time unit $\Delta$ can be calculated as:

$$\Delta=T_{VCO}/K=1/(K \cdot f_{vco}),$$

where $T_{VCO}$ represents a period of the multi-stage voltage-controlled oscillator VCO.

Figure 4:
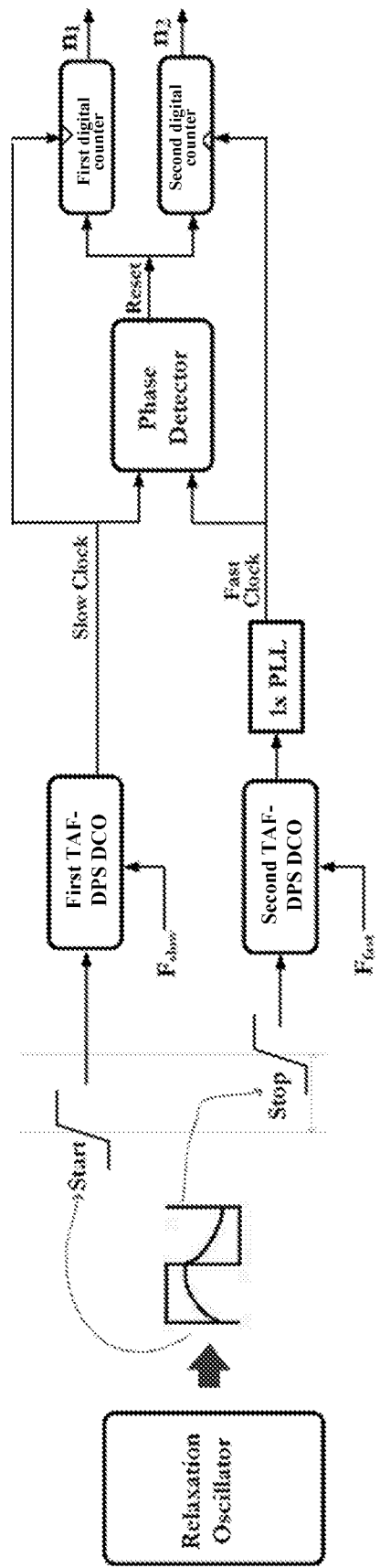
FIG. 4 schematically shows a vernier caliper based on the TAF-DPS clock generator and its working principle.

FIG. 4 schematically shows a vernier caliper based on the TAF-DPS clock generator and its working principle. The left figure of FIG. 4 schematically shows a resonator to represent a measured object. The pulse waveform graph in the middle of FIG. 4 schematically shows an output signal of the resonator with an unknown frequency. The figure in the right of FIG. 4 shows a TAF-DPS vernier caliper (i.e., a vernier caliper based on the TAF-DPS clock generator). The TAF-DPS vernier caliper detects the frequency of the output signal of the resonator.

The TAF-DPS vernier caliper comprises:

a first TAF-DPS clock generator, used as a slow TAF-DPS clock generator, wherein the first TAF-DPS clock generator is configured to receive a slow control word $F_{slow}$ at its second input terminal, the first TAF-DPS clock generator further comprises a third input terminal configured to receive a start signal of one pulse period of an input voltage signal, and the first TAF-DPS clock generator is configured to output a slow clock signal at its output terminal;

a second TAF-DPS clock generator, used as a fast TAF-DPS clock generator, wherein the second TAF-DPS clock generator is configured to receive a fast control word $F_{fast}$ at its second input terminal, the second TAF-DPS clock generator further comprises a third input terminal configured to receive an stop signal of one pulse period of the input voltage signal, and the second TAF-DPS clock generator is configured to output a fast clock signal at its output terminal;

a phase detector, configured to detect a coincidence point of the slow clock signal and the fast clock signal, wherein edges of the slow clock signal and the fast clock signal are aligned at the coincidence point, and the phase detector comprises a first input terminal configured to receive the slow clock signal, a second input terminal configured to receive the fast clock signal, and an output terminal configured to output a reset signal when the coincidence point is detected;

a first digital counter, which comprises a clock input terminal configured to receive the slow clock signal, a reset input terminal configured to receive the reset signal from the phase detector, and an output terminal configured to output the slow clock signal stored in the first digital counter when the reset signal is received, wherein the number of iterations of the output slow clock signal is stored as a first digital value $n_1$, and the first digital counter is reset after the stored slow clock signal is output;

a second digital counter, which comprises a clock input terminal configured to receive the fast clock signal, a reset input terminal configured to receive the reset signal from the phase detector, and an output terminal configured to output the fast clock signal stored in the second digital counter when the reset signal is received, wherein the number of iterations of the output fast clock signal is stored as a second digital value $n_2$, and the second digital counter is reset after the stored fast clock signal is output;

a calculation module (not shown in the figure), configured to calculate a time of flight (TOF) between the start signal and the stop signal according to the first digital value $n_1$ and the second digital value $n_2$, so as to obtain a period of the measured signal. For example, in the case of measuring a voltage signal output by a resistive and capacitive sensing apparatus, the change in its capacitance value and resistance value can further be obtained.

In the present embodiment, $F_{slow}=I$, where I is an integer greater than or equal to 2, and $F_{fast}=(I-1)+r$. As described above, r can be input freely by the user. Therefore, the accuracy of F may be arbitrary, that is, the output frequency of the related TAF-DPS clock generator may be arbitrary.

The first TAF-DPS clock generator comprises:

a first TAF-DPS digital-controlled oscillator DCO1, configured to generate a slow base time unit $\Delta_{slow}$;

a first TAF-DPS frequency synthesizer (not shown in the figure), configured to output a slow TAF clock signal according to $F_{slow}$ and $\Delta_{slow}$ which is obtained from the DCO1.

All of input, output and intermediate parameters of the first TAF-DPS DCO1 are digital values. In particular, the first TAF-DPS DCO1 receives a reference signal $CK_{ref1}$ with a frequency $f_{ref1}$ at its first input terminal. The first TAF-DPS DCO1 generates a plurality of signals according to the reference signal $CK_{ref1}$, for example, 16 signals. These signals are signals whose phases are shift equably, thus a spacing frequency between the phases of every two adjacent signals of the 16 signals is $f_{div1}=f_{ref1}/16$. The time interval of the phase shift between every two signals is taken as the slow base time unit $\Delta_{slow}$. The first TAF-DPS DCO1 receives a control word $F_{slow}$ at its second input terminal, and then the first TAF-DPS frequency synthesizer included in the first TAF-DSP clock generator outputs a signal with the frequency $f_{DCO1}$ according to the control word $F_{slow}$ and the slow base time unit $\Delta_{slow}$, wherein it can be calculated through the following equation:

$$f_{DCO1}=1/(F_{slow} \cdot \Delta_{slow})=f_{ref1}/F_{slow}$$

The second TAF-DPS clock generator comprises:

a second TAF-DPS digital-controlled oscillator DCO2, configured to generate a fast base time unit $\Delta_{fast}$;

a second TAF-DPS frequency synthesizer (not shown in the figure), configured to output a fast TAF clock signal according to $F_{fast}$ and $\Delta_{fast}$ which is obtained from the DCO2;

1×PLL (a phase-locked loop with a frequency dividing ratio of 1), configured to receive the fast TAF clock signal from the second TAF-DPS frequency synthesizer as an input signal of the phase-locked loop and to output the slow clock signal as an output signal of the phase-locked loop according to the input signal, wherein a frequency ratio of the input signal and the output signal is 1.

All of input, output and intermediate parameters of the second TAF-DPS DCO2 are digital values. In particular, the second TAF-DPS DCO2 receives a reference signal $CK_{ref2}$ with a frequency $f_{ref2}$ at its first input terminal. The second TAF-DPS DCO2 generates a plurality of signals according to the reference signal $CK_{ref2}$, for example, 16 signals. These signals are signals whose phases are shift equably, thus a spacing frequency between the phases of every two adjacent signals of the 16 signals is $f_{div2}=f_{ref2}/16$. The time interval of the phase shift between every two signals is taken as the slow base time unit $\Delta_{fast}$. The second TAF-DPS DCO2 receives a control word $F_{fast}$ at its second input terminal, and then the second TAF-DPS frequency synthesizer included in the second TAF-DSP clock generator outputs a signal with the frequency $f_{DCO2}$ according to the control word $F_{fast}$ and the fast base time unit $\Delta_{fast}$, wherein it can be calculated through the following equation:

$$f_{DCO2}=1/(F_{fast} \cdot \Delta_{fast})=f_{ref2}/F_{fast}$$

It can be seen from the equations that arbitrary frequencies $f_{DCO1}$ and $f_{DCO2}$ can be obtained as long as the digit resource provided for the control words $F_{slow}$ and $F_{fast}$ is large enough. That is, accuracy detection with almost arbitrary granularity can be conducted on the reference frequencies $f_{ref1}$ and $f_{ref2}$. In addition, since the input, output and intermediate parameters of both the first TAF-DPS DCO1 and the second TAF-DPS DCO2 are digital values, fully digital frequency source can be realized. For example, the frequency source can be realized by software simulation, which saves space and cost.

Figure 5:
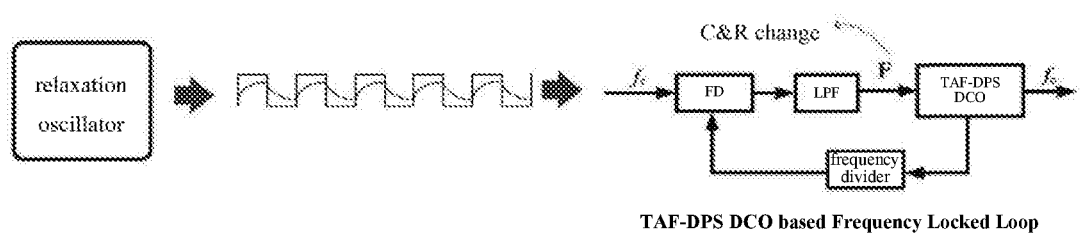
FIG. 5 schematically shows a frequency-locked loop based on the TAF-DPS clock generator and its working principle.

FIG. 5 schematically shows a frequency-locked loop based on the TAF-DPS clock generator and its working principle. The left figure of FIG. 5 schematically shows a resonator to represent a detected object. The pulse waveform graph in the middle of FIG. 5 schematically shows an output signal of the resonator with an unknown frequency. The right figure of FIG. 5 shows a TAF-DPS frequency-locked loop FLL, which detects the frequency of the output signal of the resonator. In particular, the output signal of the resonator with an unknown frequency is input to the frequency-locked loop FLL as a reference signal, the reference signal is compared with a clock signal generated by the TAF-DPS clock generator in terms of frequency, and a control word F of the TAF-DPS clock generator is adjusted iteratively according to the comparison result until the frequency of the clock signal generated by the TAF-DPS clock generator is consistent with the frequency of the reference signal, so as to calculate the frequency of the reference signal according to the control word F. For example, in the case of measuring a voltage signal output by a resistive and capacitive sensing apparatus, changes in a capacitance value and a resistance value of the resistive and capacitive sensing apparatus can be further obtained.

The frequency-locked loop FLL as shown in FIG. 5 comprises:

a frequency detector FD, a low-pass filter LPF connected to the downstream of the frequency detector FD, a TAF-DPS DCO connected to the downstream of the low-pass filter LPF, and a frequency divider connected between the TAF-DPS DCO and the frequency detector FD, wherein the frequency detector FD detects a difference between the frequency $f_r$ of the reference signal input to the frequency detector FD and a frequency $f_o'$ of a signal from the frequency divider, and output a difference variable; the low-pass filter LPF is configured to generate a control variable used for the TAF-DPS DCO at the downstream after performing low-pass filtering on the difference variable to remove a high frequency component, wherein the control variable comprises a control word F. Subsequently, the TAF-DPS DCO generates an output signal with the frequency $f_o$ according to the control variable. After the frequency of the output signal is divided by the frequency divider by a factor of 1/N, the signal with the frequency $f_o'$ is obtained and it is delivered to the frequency detector FD, wherein N is an integer greater than or equal to 1.

Herein, the frequency divider can also be omitted, and then the output signal $f_o$ of the frequency-locked loop FLL is directly input to the frequency detector FD. The frequency detector FD detects a difference between the frequency $f_r$ of the reference signal input to the frequency detector FD and the frequency $f_o$ of the output signal of the frequency-locked loop FLL, and outputs a difference variable. After performing low-pass filtering on the difference variable to remove a high frequency component, the low-pass filter LPF generates a control variable used for the TAF-DPS DCO at the downstream. The control variable comprises the control word F. Subsequently, the TAF-DPS DCO generates an output signal with the frequency $f_o$ according to the control variable, and the output signal is delivered to the frequency detector FD.

In the present embodiment, both the difference variable and the control variable are digital values.

Advantages of the frequency-locked loop based on the TAF-DPS clock generator are corresponding to those of the vernier caliper based on the TAF-DPS clock generator.

Figure 6:
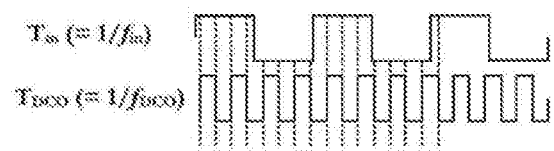
FIG. 6 schematically shows a principle diagram used for frequency detection.

FIG. 6 schematically shows a schematic diagram for frequency detection. Herein, a first signal with a frequency $f_{in}$ and a second signal with a frequency $f_{DCO}$ are taken as driving clocks. The second signal is for example obtained from a TAF-DPS clock generator. Firstly, the period of the second signal is determined by a detection of a rising edge and a falling edge. Then, the number of rising edges of the first signal detected within each period of the second signal is determined. If two or more rising edges of the first signal are detected within one period of the second signal, then it can be determined the fact of $f_{in}>f_{DCO}$. Otherwise, take a half period of the second signal as a basis, wherein the half period comprises one rising edge and one falling edge of the second signal. The first signal is sampled by taking the rising edge and the falling edge within the half period of the second signal as sampling time points. If one rising edge and one falling edge of the first signal are sampled, then it can be considered $f_{in}=f_{DCO}$. Otherwise, it would be considered $f_{in}<f_{DCO}$. The method for detecting a relationship between frequencies of two input signals according to the present disclosure can be implemented simply, quickly and at a low cost.

There is further provided in the present disclosure a method for identifying a frequency of a voltage signal, wherein the voltage signal is input to a frequency source with an adjustable frequency, and the frequency source with an adjustable frequency identifies a frequency of the input voltage signal.

Figure 7:
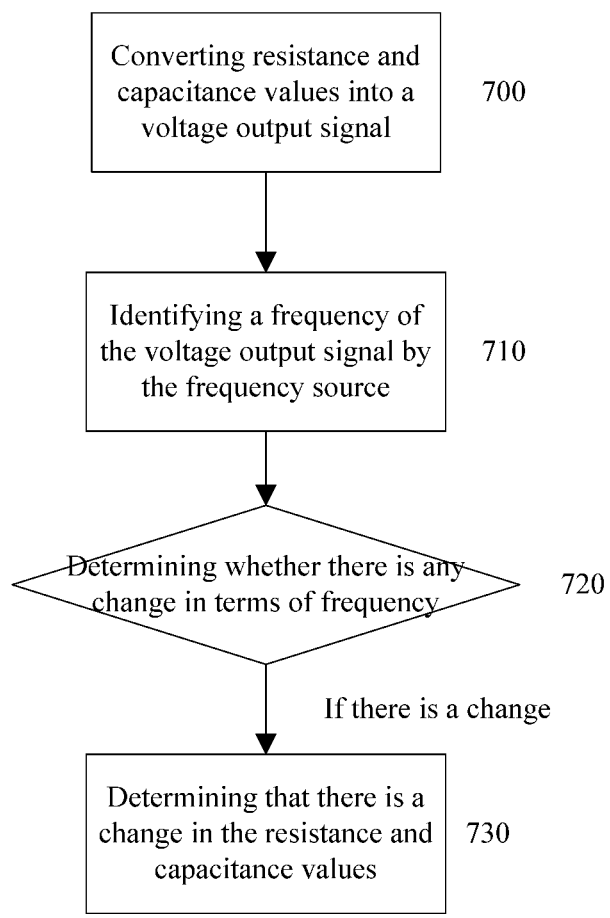
FIG. 7 schematically shows one embodiment of a method for identifying a frequency of a voltage signal according to the present disclosure.

FIG. 7 schematically shows one embodiment of a method for identifying a frequency of a voltage signal according to the present disclosure. Herein, detecting a change in resistance and capacitance values of a resistive and capacitive sensing apparatus by utilizing the frequency source with an adjustable frequency comprises following steps:

Step 700: converting resistance and capacitance values into a voltage output signal through the resistive and capacitive sensing apparatus;

Step 710: delivering the voltage output signal to the frequency source and identifying a frequency of the voltage output signal by the frequency source;

Step 720: determining whether there is any change in the frequency of the voltage output signal compared to a frequency of a voltage output signal previously stored in the resistive and capacitive sensing apparatus; if there is a change, then Step 730: determining that there is a change in the resistance and capacitance values.

In one implementation of the present disclosure, a circuit comprising the TAF-DPS clock generator is used as the frequency source, wherein the TAF-DPS clock generator comprises:

a first input terminal, configured to receive a base time unit Δ;

a second input terminal, configured to receive a frequency/period control word F=I+r, where I is an integer, and r is a fraction of 0≤r<1;

a direct period synthesis unit, configured to create a first period $T_A=I*\Delta$ and a second period $T_B=(I+1)*\Delta$; and an output terminal, configured to output a clock signal which is composed of pulses with the first period $T_A$ and pulses with the second period $T_B$ in an interleaved manner, wherein possibilities of occurrence for the first period $T_A$ and the second period $T_B$ are controlled by the value of r. In particular, the possibility of occurrence for the first period $T_A$ is (1-r)%, and the possibility of occurrence for the second period $T_B$ is r %, wherein the frequency and the period of the TAF-DPS clock generator is calculated as $1/f_{TAF}=T_{TAF}=F*\Delta$ according to the tine average frequency of the clock signal, and the control word F takes on a linear relationship with the period of the TAF-DPS clock generator, thereby taking on a one-to-one correspondence relationship with the measured capacitance value or resistance value of the resistive and capacitive sensing apparatus, so as to obtain the change in the capacitance value or the resistance value.

In one implementation of the present disclosure, the output signal of the resistive and capacitive sensing apparatus can be input, as a reference signal, to a frequency-locked loop FLL constructed based on the TAF-DPS clock generator;

the reference signal is compared with a clock signal generated by the TAF-DPS clock generator in terms of frequency;

a control word F of the TAF-DPS clock generator is adjusted iteratively according to a comparison result until the frequency of the clock signal generated by the TAF-DPS clock generator is consistent with the frequency of the reference signal, so as to obtain the frequency of the reference signal according to the control word F; and the change in the capacitance and resistance values of the resistive and capacitive sensing apparatus is derived.

In one implementation of the present disclosure, the frequency-locked loop FLL comprises:

a frequency detector FD, a low-pass filter LPF connected to the downstream of the frequency detector FD and a TAF-DPS DCO connected to the downstream of the low-pass filter LPF.

In one implementation of the present disclosure, a difference between a frequency $f_r$ of the reference signal input to the frequency detector FD and a frequency $f_o$ of an output signal of the frequency-locked loop FLL is detected by the frequency detector FD, and a difference variable is output;

a control variable used for the TAF-DPS digital-controlled oscillator at the downstream is generated after low-pass filtering is performed on the difference variable by the low-pass filter LPF to remove a high frequency component, wherein the control variable comprises the control word F;

an output signal with the frequency $f_o$ is generated according to the control variable by the TAF-DPS DCO; and the output signal is transmitted to the frequency detector FD.

In one implementation of the present disclosure, the frequency detector FD determines a number of rising edges of the reference signal detected within one period of the output signal which is output from the frequency-locked loop FLL and has the known frequency $f_o$, wherein the frequency $f_r$ of the reference signal is unknown;

if two or more rising edges of the reference signal are detected within one period of the output signal, then it can be determined the fact of $f_r > f_o$;

otherwise, consider a half period of the output signal as a basis which includes one rising edge and one falling edge of the output signal, and take the rising edge and the falling edge within the half period of the output signal as sampling time points to sample the reference signal, if one rising edge and one falling edge of the reference signal are sampled, then it is determined $f_r = f_o$; otherwise, it is determined $f_r < f_o$.

In one implementation of the present disclosure, the frequency-locked loop FLL further includes a frequency divider connected between the TAF-DPS DOC and the frequency detector FD.

In one implementation of the present disclosure, a difference between the frequency $f_r$ of the reference signal input to the frequency detector FD and a frequency $f_o'$ of a signal from the frequency divider is detected by the frequency detector FD, and a difference variable is output;

the control variable used for the TAF-DPS digital-controlled oscillator at the downstream is generated after low-pass filtering is performed on the difference variable by the low-pass filter LPF to remove a high frequency component, wherein the control variable comprises a control word F;

the output signal with the frequency $f_o$ is generated according to the control variable by the TAF-DPS DCO;

the frequency of the output signal is divided by the frequency divider with a factor of 1/N so as to obtain a signal with the frequency $f_o'$; and the signal with the frequency $f_o'$ is delivered to the frequency detector FD, wherein N is an integer greater than or equal to 1.

In one implementation of the present disclosure, the frequency detector FD determines a number of rising edges of the reference signal detected within one period of the frequency $f_o'$, wherein the frequency $f_r$ of the reference signal is unknown;

if two or more rising edges of the reference signal are detected within one period of the output signal, then it is determined the fact of $f_r > f_o'$;

otherwise, consider a half period of the output signal as a basis which includes one rising edge and one falling edge of the output signal, and take the rising edge and the falling edge within the half period of the output signal as sampling time points to sample the reference signal, if one rising edge and one falling edge of the reference signal are sampled, then it is determined $f_r = f_o'$; otherwise, it is determined $f_r < f_o'$.

In one implementation of the present disclosure, both the difference variable and the control variable are digital values.

There is further provided in the present disclosure an electronic device comprising a frequency source with an adjustable frequency according to the present disclosure.

The present disclosure starts from the problem in the prior art that the detection accuracy is constrained by a frequency of a frequency source when an unknown reference frequency is detected by using the frequency source, and proposes a frequency source with an adjustable frequency based on the TAF-DPS clock generator. In particular, the present disclosure gives the vernier caliper based on the TAF-DPS clock generator and the frequency-locked loop based on based on the TAF-DPS clock generator. By modifying the digits resource provided for the TAF-DPS clock generator, the accuracy in the frequency detection can be adjusted. In addition, the digital-controlled oscillator DCO based on the TSF-DPS can be adopted in both the vernier caliper based on the TAF-DPS clock generator and the frequency-locked loop based on the TAF-DPS clock generator as the clock generator, which brings an advantage of fully digitizing.

The above descriptions are just specific implementations of the present disclosure, but the protection scope of the present disclosure is not limited thereto. Any alternation or replacement that can be easily conceived by those skilled in the art that are familiar with the technical field shall be covered within the protection scope of the present disclosure. Therefore, the protection scope of the present disclosure shall be subject to the protection scope of the present claims.

What is claimed is:

1. A frequency source with an adjustable frequency, comprises an input terminal for receiving an input voltage signal, and is configured to identify a frequency of the input voltage signal, and further comprises a time-average-frequency direct period synthesis TAF-DPS clock generator, wherein the TAF-DPS clock generator comprises:

a first input terminal for receiving a base time unit $\Delta$;

a second input terminal for receiving a frequency/period control word F=I+r, where I is an integer, and $0 \leq r < 1$;

a direct period synthesis unit for creating a first period $T_A = I*\Delta$ and a second period $T_B = (I+1)*\Delta$;

an output terminal for outputting a clock signal formed by pulses with the first period $T_A$ and pulses with the second period $T_B$ in an interleaved manner, wherein possibilities of occurrence for the first period $T_A$ and the second period $T_B$ are controlled by a value of r, wherein a frequency and a period of the TAF-DPS clock generator is calculated as $1/f_{TAF} = T_{TAF} = F*\Delta$, according to a time average frequency of the clock signal, and the control word F takes on a linear relationship with the period of the TAF-DPS clock generator.

2. The frequency source according to claim 1, wherein the base time unit $\Delta$ is generated by a multi-stage voltage-controlled oscillator, wherein the multi-stage voltage-controlled oscillator is locked to a reference frequency through a phase-locked loop, so that a frequency $f_{vco}$ of the multi-stage voltage-controlled oscillator is a given value, and the multi-stage voltage-controlled oscillator outputs K signals of which phases are shift equably, where K is an integer greater than 1, and the base time unit $\Delta$ can be calculated as:

$$\Delta = T_{VCO}/K = 1/(K \cdot f_{vco})$$

wherein $T_{VCO}$ represents a period of the multi-stage voltage-controlled oscillator.

3. The frequency source according to claim 1, wherein I and r are input by a user, wherein accuracy of the frequency of the TAF-DPS clock generator is associated with digits allocated to r.

4. The frequency source according to claim 1, wherein the frequency source comprises a TAF-DPS vernier caliper, and the TAF-DPS vernier caliper comprises:

a first TAF-DPS clock generator, used as a slow TAF-DPS clock generator, wherein the first TAF-DPS clock generator comprises a second input terminal for receiving a slow control word $F_{slow}$, and a third input terminal for receiving a start signal of one pulse period of the input voltage signal, and is configured to output a slow clock signal at its output terminal;

a second TAF-DPS clock generator, used as a fast TAF-DPS clock generator, wherein the second TAF-DPS clock generator comprises a second input terminal for receiving a fast control word $F_{fast}$, and a third input terminal for receiving a stop signal of the pulse period of the input voltage signal, and is configured to output a fast clock signal at its output terminal;

a phase detector, configured to detect a coincidence point of the slow clock signal and the fast clock signal, wherein edges of the slow clock signal and the fast clock signal are aligned at the coincidence point, and the phase detector comprises a first input terminal for receiving the slow clock signal, a second input terminal for receiving the fast clock signal, and an output terminal for outputting a reset signal when the coincidence point is detected;

a first digital counter, comprising a clock input terminal for receiving the slow clock signal, a reset input terminal for receiving the reset signal from the phase detector, and an output terminal for outputting the slow clock signal stored in the first digital counter when the reset signal is received, wherein the number of iterations of the output slow clock signal is stored as a first digital value, and the first digital counter is reset after the stored slow clock signal is output;

a second digital counter, comprising a clock input terminal for receiving the fast clock signal, a reset input terminal for receiving the reset signal from the phase detector, and an output terminal for outputting the fast clock signal stored in the second digital counter when the reset signal is received, wherein the number of iterations of the output fast clock signal is stored as a second digital value, and the second digital counter is reset after the stored fast clock signal is output; and a calculation module, configured to calculate a time of flight (TOF) between the start signal and the stop signal according to the first digital value and the second digital value, so as to obtain a period of the input voltage signal.

5. The frequency source according to claim 4, wherein the slow control word $F_{slow}$=I, where I is an integer greater than or equal to 2, and the fast control word $F_{fast}$=(I−1)+r.

6. The frequency source according to claim 4, wherein the first TAF-DPS clock generator comprises:

a first digital-controlled oscillator, configured to generate a slow base time unit $\Delta_{slow}$;

a first TAF-DPS frequency synthesizer, configured to output a slow TAF clock signal according to the slow control word $F_{slow}$ and the slow base time unit $\Delta_{slow}$ obtained from the first digital-controlled oscillator.

7. The frequency source according to claim 4, wherein the second TAF-DPS clock generator comprises:

a second digital-controlled oscillator, configured to generate a fast base time unit $\Delta_{fast}$;

a second TAF-DPS frequency synthesizer, configured to output a fast TAF clock signal according to the fast control word $F_{slow}$ and the fast base time unit $\Delta_{fast}$ obtained from the second digital-controlled oscillator;

1×PLL (a phase-locked loop whose frequency division ratio is 1), wherein 1×PLL represents a phase-locked loop whose frequency division ratio is 1, configured to receive the fast TAF clock signal from the second TAF-DPS frequency synthesizer as an input signal of the phase-locked loop, and output the slow clock signal as an output signal of the phase-locked loop according to the input signal of the phase-locked loop, wherein a frequency ratio of the input signal and the output signal is 1.

8. The frequency source according to claim 1, wherein the frequency source comprises a frequency-locked loop constructed based on the TAF-DPS clock generator, wherein the input voltage signal is input to the frequency-locked loop as a reference signal, the reference signal is compared with a clock signal generated by the TAF-DPS clock generator in terms of frequency, and the control word F of the TAF-DPS clock generator is adjusted iteratively according to a comparison result until the frequency of the clock signal generated by the TAF-DPS clock generator is consistent with the frequency of the reference signal, so as to obtain the frequency of the reference signal according to the control word F.

9. The frequency source according to claim 8, wherein the frequency-locked loop comprises:

a frequency detector, a low-pass filter connected to the downstream of the frequency detector, and a TAF-DPS digital-controlled oscillator connected to the downstream of the low-pass filter.

10. The frequency source according to claim 9, wherein the frequency detector is configured to detect a difference between a frequency $f_r$ of the reference signal input to the frequency detector and a frequency $f_o$ of an output signal of the frequency-locked loop, and output a difference variable; the low-pass filter is configured to generate a control variable used for the TAF-DPS digital-controlled oscillator at the downstream after performing low-pass filtering on the difference variable to remove a high frequency component, wherein the control variable comprises the control word F; the TAF-DPS digital-controlled oscillator is configured to generate the output signal with the frequency $f_o$ according to the control variable, wherein the output signal is delivered to the frequency detector.

11. The frequency source according to claim 9, wherein the frequency-locked loop further includes a frequency divider connected between the TAF-DPS digital-controlled oscillator and the frequency detector.

12. The frequency source according to claim 11, wherein, the frequency detector is configured to detect a difference between a frequency $f_r$ of the reference signal input to the frequency detector and a frequency $f_o'$ of a signal from the frequency divider, and output a difference variable; the low-pass filter is configured to generate a control variable used for the TAF-DPS digital-controlled oscillator at the downstream after performing low-pass filtering on the difference variable to remove a high frequency component, wherein the control variable comprises the control word F; the TAF-DPS digital-controlled oscillator is configured to generate the output signal with the frequency $f_o$ according to the control variable; the frequency divider is configured to divide the frequency of the output signal with a factor of 1/N so as to generate a signal with the frequency $f_o'$, and the signal with the frequency $f_o'$ is delivered to the frequency detector, where N is an integer greater than or equal to 1.

13. The frequency source according to claim 10, wherein both the difference variable and the control variable are digital values.

14. A system for detecting a change in resistance and capacitance values of a resistive and capacitive sensing apparatus, comprising the frequency source according to claim 1, the resistive and capacitive sensing apparatus and a comparison unit, wherein the resistive and capacitive sensing apparatus converts the resistance and capacitance values into a voltage signal, the frequency source identifies a frequency of the voltage signal, wherein the comparison unit compares the identified frequency with a frequency of a voltage signal of the resistive and capacitive sensing apparatus previously stored, and determines that there is a change in the resistance and capacitance values of the resistive and capacitive sensing apparatus if a change is determined by the comparison between the identified frequency with a frequency of a voltage signal of the resistive and capacitive sensing apparatus previously stored.

15. The system according to claim 14, wherein the resistive and capacitive sensing apparatus is a relaxation oscillator, wherein the relaxation oscillator comprises an operational amplifier and a sensing capacitor connected to one input terminal of the operational amplifier, wherein the operational amplifier outputs a voltage signal having a frequency related to the resistance and capacitance values in the relaxation oscillator.

16. A method for identifying a frequency of a voltage signal, wherein the voltage signal is input to the frequency source with an adjustable frequency according to claim 1, and the frequency source identifies a frequency of the input voltage signal, comprising following steps:
 converting resistance and capacitance values into a voltage signal by a resistive and capacitive sensing apparatus;
 delivering the voltage signal to the frequency source with an adjustable frequency and identifying a frequency of the voltage signal by the frequency source with an adjustable frequency;
 determining whether there is a change by comparing the frequency of the voltage signal with a frequency of a voltage signal of the resistive and capacitive sensing apparatus previously stored; if there is a change, then it is determined that there is a change in the resistance and capacitance values.

17. The frequency source according to claim 2, wherein the frequency source comprises a TAF-DPS vernier caliper, and the TAF-DPS vernier caliper comprises:
 a first TAF-DPS clock generator, used as a slow TAF-DPS clock generator, wherein the first TAF-DPS clock generator comprises a second input terminal for receiving a slow control word $F_{slow}$, and a third input terminal for receiving a start signal of one pulse period of the input voltage signal, and is configured to output a slow clock signal at its output terminal;
 a second TAF-DPS clock generator, used as a fast TAF-DPS clock generator, wherein the second TAF-DPS clock generator comprises a second input terminal for receiving a fast control word $F_{fast}$, and a third input terminal for receiving a stop signal of the pulse period of the input voltage signal, and is configured to output a fast clock signal at its output terminal;
 a phase detector, configured to detect a coincidence point of the slow clock signal and the fast clock signal, wherein edges of the slow clock signal and the fast clock signal are aligned at the coincidence point, and the phase detector comprises a first input terminal for receiving the slow clock signal, a second input terminal for receiving the fast clock signal, and an output terminal for outputting a reset signal when the coincidence point is detected;
 a first digital counter, comprising a clock input terminal for receiving the slow clock signal, a reset input terminal for receiving the reset signal from the phase detector, and an output terminal for outputting the slow clock signal stored in the first digital counter when the reset signal is received, wherein the number of iterations of the output slow clock signal is stored as a first digital value, and the first digital counter is reset after the stored slow clock signal is output;
 a second digital counter, comprising a clock input terminal for receiving the fast clock signal, a reset input terminal for receiving the reset signal from the phase detector, and an output terminal for outputting the fast clock signal stored in the second digital counter when the reset signal is received, wherein the number of iterations of the output fast clock signal is stored as a second digital value, and the second digital counter is reset after the stored fast clock signal is output; and
 a calculation module, configured to calculate a time of flight (TOF) between the start signal and the stop signal according to the first digital value and the second digital value, so as to obtain a period of the input voltage signal.

18. The frequency source according to claim 2, wherein the frequency source comprises a frequency-locked loop constructed based on the TAF-DPS clock generator, wherein the input voltage signal is input to the frequency-locked loop as a reference signal, the reference signal is compared with a clock signal generated by the TAF-DPS clock generator in terms of frequency, and the control word F of the TAF-DPS clock generator is adjusted iteratively according to a comparison result until the frequency of the clock signal generated by the TAF-DPS clock generator is consistent with the frequency of the reference signal, so as to obtain the frequency of the reference signal according to the control word F.

\* \* \* \* \*